(12) United States Patent
Arasawa et al.

(10) Patent No.: US 8,482,690 B2
(45) Date of Patent: Jul. 9, 2013

(54) LIQUID CRYSTAL DISPLAY DEVICE AND ELECTRONIC DEVICE INCLUDING THE SAME

(75) Inventors: Ryo Arasawa, Kanagawa (JP); Hideaki Shishido, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 240 days.

(21) Appl. No.: 12/897,289

(22) Filed: Oct. 4, 2010

(65) Prior Publication Data

US 2011/0085104 A1   Apr. 14, 2011

(30) Foreign Application Priority Data

Oct. 9, 2009   (JP) .................. 2009-235287

(51) Int. Cl.
*G02F 1/136* (2006.01)
*H01L 29/04* (2006.01)
*H01L 27/14* (2006.01)

(52) U.S. Cl.
USPC .............. 349/41; 349/43; 257/59; 257/72

(58) Field of Classification Search
USPC ................. 349/43, 41; 257/59, 72
See application file for complete search history.

(56) References Cited

U.S. PATENT DOCUMENTS

| | | | |
|---|---|---|---|
| 5,357,136 A * | 10/1994 | Yoshioka | ............. 257/383 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,657,260 B2 | 12/2003 | Yamazaki et al. | |
| 6,689,492 B1 | 2/2004 | Yamazaki et al. | |
| 6,724,443 B1 | 4/2004 | Sano et al. | |
| 6,727,522 B1 | 4/2004 | Kawasaki et al. | |
| 6,737,306 B2 | 5/2004 | Yamazaki et al. | |
| 6,788,355 B1 | 9/2004 | Ihida et al. | |

(Continued)

FOREIGN PATENT DOCUMENTS

| | | |
|---|---|---|
| EP | 1 058 484 A1 | 12/2000 |
| EP | 1 209 748 A1 | 5/2002 |

(Continued)

OTHER PUBLICATIONS

Ohara, H et al., "Amorphous In-Ga-Zn-Oxide TFTs with Suppressed Variation for 4.0 inch QVGA Amoled Display," AM-FPD '09 Digest of Technical Papers, Jul. 1, 2009, pp. 227-230, The Japan Society of Applied Physics.

(Continued)

*Primary Examiner* — Mike Qi
(74) *Attorney, Agent, or Firm* — Fish & Richardson P.C.

(57) ABSTRACT

An object is to provide a liquid crystal display device in which a pixel including a thin film transistor using an oxide semiconductor has a high aperture ratio. The liquid crystal display device includes a plurality of pixels each including a thin film transistor and a pixel electrode. The pixel is electrically connected to a first wiring functioning as a scan line. The thin film transistor includes an oxide semiconductor layer over the first wiring with a gate insulating film therebetween. The oxide semiconductor layer is extended beyond the edge of a region where the first wiring is provided. The pixel electrode and the oxide semiconductor layer overlap with each other.

19 Claims, 14 Drawing Sheets

U.S. PATENT DOCUMENTS

| | | | |
|---|---|---|---|
| 6,913,956 B2 | 7/2005 | Hamada et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,147,530 B2 | 12/2006 | Yamazaki et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,737,517 B2* | 6/2010 | Kawamura et al. | 257/432 |
| 7,825,588 B2 | 11/2010 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0042484 A1 | 3/2003 | Horikoshi et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0146566 A1 | 6/2007 | Hosoya | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0036698 A1 | 2/2008 | Kawasaki et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0001881 A1 | 1/2009 | Nakayama | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0179199 A1 | 7/2009 | Sano et al. | |
| 2009/0224245 A1 | 9/2009 | Umezaki | |
| 2009/0278122 A1 | 11/2009 | Hosono et al. | |
| 2009/0280600 A1 | 11/2009 | Hosono et al. | |
| 2009/0283762 A1 | 11/2009 | Kimura | |
| 2010/0065844 A1 | 3/2010 | Tokunaga | |
| 2010/0072471 A1* | 3/2010 | Yamazaki et al. | 257/43 |
| 2010/0092800 A1 | 4/2010 | Itagaki et al. | |
| 2010/0109002 A1 | 5/2010 | Itagaki et al. | |
| 2011/0084265 A1* | 4/2011 | Arasawa et al. | 257/43 |

FOREIGN PATENT DOCUMENTS

| | | |
|---|---|---|
| EP | 1 737 044 A1 | 12/2006 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10082991 A | 3/1998 |
| JP | 11-505377 A | 5/1999 |
| JP | 2000-044236 A | 2/2000 |
| JP | 2000-150900 A | 5/2000 |
| JP | 2001-036087 A | 2/2001 |
| JP | 2001-052873 A | 2/2001 |
| JP | 2001-117115 A | 4/2001 |
| JP | 2001-125134 A | 5/2001 |
| JP | 2002-076356 A | 3/2002 |
| JP | 2002-289859 A | 10/2002 |
| JP | 2003-050405 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-077822 A | 3/2005 |
| JP | 2005077822 A | 3/2005 |
| JP | 2006-165529 A | 6/2006 |
| JP | 2008-042043 A | 2/2008 |
| JP | 2009-031750 A | 2/2009 |
| JP | 2009-099887 A | 5/2009 |
| WO | 2004/114391 A1 | 12/2001 |
| WO | 2004/114391 A1 | 12/2004 |
| WO | 2006/051993 A2 | 5/2006 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size Amoled.," AM-FPD '08 Digest of Technical Papers, Jul. 2, 2008, pp. 275-278.

Park. S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. Amoled Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA Amoled Driven by the Threshold Voltage Controlled Amorphous GIZO (Ga2O3-In2O3-ZnO) TFT," SID Digest '08 : SID International.Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2010/066746, dated Nov. 30, 2010, 2 pages.

International Search Report, PCT Application No. PCT/JP2010/066744, dated Dec. 7, 2010, 4 pages.

Written Opinion, PCT Application No. PCT/JP2010/066746, dated Nov. 30, 2010, 3 pages.

Written Opinion, PCT Application No. PCT/JP2010/066744, dated Dec. 7, 2010, 4 pages.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays,"AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature DEpendence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology,"SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA Amoled Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas." The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-Bo Systems [A; Fe, Ga, or Al; B: Mg, Mn, Fe, Ni, Cu,or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al.. "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size Amoled Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar., 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn, J. Appl. Phys. (Japanese Journal of Applied Physics) , 2006, vol. 45, No. 5B, pp. 4303-4308

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed.using single-crystalline InGaO3(ZnO)5 films," Appl. Phys. Lett. (Applied Physics Letters) , Sep. 13. 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA Amoled Display Using In-Ga-Zn-Oxide TFTS With a Novel Passivation Layer," SID Digest '09 : SID International Symposium Digest of Technical Papers, May 31, 2009, pp. 284-287.

Nguyen, Khiema, United States Patent and Trademark Office, Office Action of U.S. Appl. No. 12/897,299 dated Jul. 10, 2012, 41 pages.

* cited by examiner

LIQUID CRYSTAL DISPLAY DEVICE AND ELECTRONIC DEVICE INCLUDING THE SAME

TECHNICAL FIELD

The present invention relates to a liquid crystal display device. In addition, the present invention relates to an electronic device including the liquid crystal display device.

BACKGROUND ART

A thin film transistor formed over a flat plate such as a glass substrate is manufactured using amorphous silicon or polycrystalline silicon, as typically seen in a liquid crystal display device. A thin film transistor manufactured using amorphous silicon has low field effect mobility, but can be formed over a larger glass substrate. In contrast, a thin film transistor manufactured using crystalline silicon has high field effect mobility, but needs a crystallization step such as laser annealing and is not always suitable for a larger glass substrate.

In view of the above, attention has been drawn to a technique by which a thin film transistor is manufactured using an oxide semiconductor and applied to an electronic device or an optical device. For example, Patent Document 1 discloses a technique by which a thin film transistor is manufactured using zinc oxide or an In—Ga—Zn—O-based oxide semiconductor for an oxide semiconductor film and such a transistor is used as a switching element or the like of a liquid crystal display device.

REFERENCE

Patent Document 1: Japanese Published Patent Application No. 2009-099887

DISCLOSURE OF INVENTION

The field effect mobility of a thin film transistor in which an oxide semiconductor is used for a channel region is higher than that of a thin film transistor in which amorphous silicon is used for a channel region. A pixel including such a thin film transistor formed using an oxide semiconductor is expected to be applied to a display device such as a liquid crystal display device. Furthermore, although the area per pixel is expected to decrease in a higher value-added liquid crystal display device such as a 3D display or a 4K2K display, a liquid crystal display device including a pixel with increased aperture ratio is desired.

In view of the foregoing, an object of the present invention is to provide a liquid crystal display device in which a pixel including a thin film transistor using an oxide semiconductor has a high aperture ratio.

According to one embodiment of the present invention, a liquid crystal display device includes a pixel including a thin film transistor and a pixel electrode. The pixel is electrically connected to a first wiring functioning as a scan line. The thin film transistor includes an oxide semiconductor layer over the first wiring with a gate insulating film therebetween. The oxide semiconductor layer is extended beyond the edge of a region where the first wiring is provided. The pixel electrode and the oxide semiconductor layer overlap with each other.

According to one embodiment of the present invention, a liquid crystal display device includes a pixel including a thin film transistor and a pixel electrode. The pixel is electrically connected to a first wiring functioning as a scan line and a second wiring functioning as a signal line. The thin film transistor includes an oxide semiconductor layer over the first wiring with a gate insulating film therebetween. The oxide semiconductor layer is extended beyond the edge of a region where the first wiring is provided. The second wiring is extended over the gate insulating film over the first wiring and is on and in contact with the oxide semiconductor layer. The pixel electrode and the oxide semiconductor layer overlap with each other.

According to one embodiment of the present invention, a liquid crystal display device includes a thin film transistor and a pixel electrode. The pixel is electrically connected to a first wiring functioning as a scan line and a second wiring functioning as a signal line. The thin film transistor includes an oxide semiconductor layer over the first wiring with a gate insulating film therebetween. The oxide semiconductor layer is extended beyond the edge of a region where the first wiring is provided. The second wiring is extended over the gate insulating film over the first wiring and an interlayer insulating film over the gate insulating film, and is on and in contact with the oxide semiconductor layer. The pixel electrode and the oxide semiconductor layer overlap with each other.

It is possible to increase the aperture ratio of a pixel including a thin film transistor in which an oxide semiconductor is used. Thus, a liquid crystal display device can include a high definition display portion.

BEST MODE FOR CARRYING OUT THE INVENTION

Figure 1A:
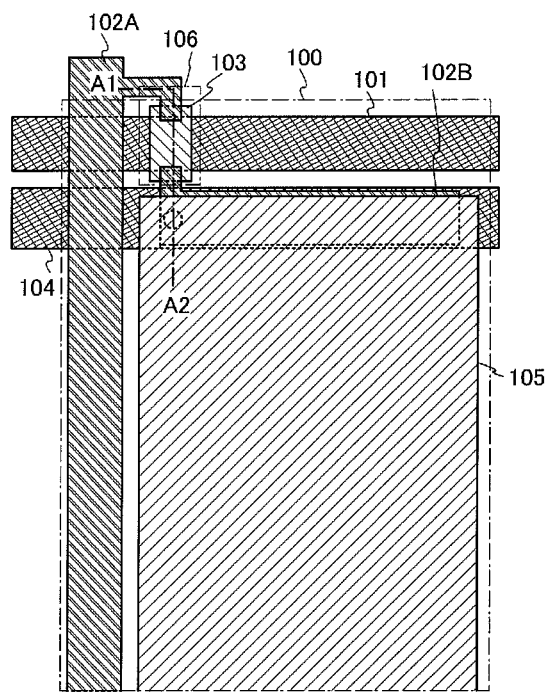
FIGS. 1A and 1B are a top view and a cross-sectional view of a liquid crystal display device.

Embodiments of the present invention will be described in detail with reference to the accompanying drawings. The present invention is not limited to the following description, and it is easily understood by those skilled in the art that modes and details disclosed herein can be modified in various ways without departing from the spirit and the scope of the present invention. Therefore, the present invention is not to be construed as being limited to the content of the embodiments included herein. Note that in the structures of the present invention described below, the same reference numerals are used for the same portions and portions having similar functions in different drawings, and the description thereof is not repeated.

Note that the size, the thickness of a layer, or a region of each structure illustrated in drawings in this specification is exaggerated for simplicity in some cases. Therefore, embodiments of the present invention are not limited to such scales.

Note that the terms such as "first", "second", and "third" used in this specification are used in order to avoid confusion of structural elements and do not mean limitation of the number of the structural elements. Therefore, for example, the term "first" can be replaced with the term "second", "third", or the like as appropriate.

Embodiment 1

In this embodiment, a liquid crystal display device will be described using a thin film transistor (hereinafter also referred to as a TFT) and an electrode functioning as a pixel electrode (such an electrode is also simply referred to as a pixel electrode) connected to the TFT, as an example. Note that a pixel refers to an element group that is composed of elements provided in each pixel of a display device, for example, an element for controlling display in accordance with an electric signal, such as a thin film transistor, an electrode functioning as a pixel electrode, or a wiring. A pixel may include a color filter or the like and may correspond to one color component whose brightness can be controlled with one pixel. Therefore, for example, in a color display device including color elements of R, G, and B, a minimum unit of an image is composed of three pixels of an R pixel, a G pixel, and a B pixel and an image can be obtained with a plurality of pixels.

Note that when it is described that "A and B are connected", the case where A and B are electrically connected to each other, and the case where A and B are directly connected to each other are included therein. Here, A and B are each an object having an electrical function. Specifically, the description "A and B are connected" includes the case where a portion between A and B can be regarded as one node in consideration of circuit operation, for example, the case where A and B are connected through a switching element such as a transistor and have the same or substantially the same potentials by conduction of the switching element, and the case where A and B are connected through a resistor and the potential difference generated at opposite ends of the resistor does not adversely affect the operation of a circuit including A and B.

FIG. 1A is a top view of a pixel. A TFT illustrated in FIG. 1A has a kind of bottom-gate structure called an inverted staggered structure in which a wiring layer serving as a source electrode and a drain electrode of the TFT is placed opposite to an oxide semiconductor layer serving as a channel region, with respect to a wiring serving as a gate.

A pixel 100 illustrated in FIG. 1A includes a first wiring 101 functioning as a scan line, a second wiring 102A functioning as a signal line, an oxide semiconductor layer 103, a capacitor line 104, and a pixel electrode 105. Moreover, the pixel 100 in FIG. 1A includes a third wiring 102B for electrically connecting the oxide semiconductor layer 103 and the pixel electrode 105, so that a thin film transistor 106 is formed.

The first wiring 101 also functions as a gate of the thin film transistor 106. The second wiring 102A also functions as one of a source electrode and a drain electrode of the thin film transistor 106 and one electrode of a storage capacitor. The third wiring 102B also functions as the other of the source electrode and the drain electrode of the thin film transistor 106. The capacitor line 104 functions as the other electrode of the storage capacitor. Note that the first wiring 101 and the capacitor line 104 are formed from the same layer, and the second wiring 102A and the third wiring 102B are formed from the same layer. In addition, the third wiring 102B and the capacitor line 104 partly overlap with each other to form a storage capacitor of a liquid crystal element.

The oxide semiconductor layer 103 included in the thin film transistor 106 is provided over the first wiring 101 with a gate insulating film (not illustrated) therebetween. The oxide semiconductor layer 103 is extended beyond the edge of a region where the first wiring 101 is provided.

Note that the description "A is extended beyond the edge of B" means that, when stacked A and B are seen in a top view, edges of A and B are not aligned and A is extended outward so that the edge of A is placed outside the edge of B.

Figure 1B:
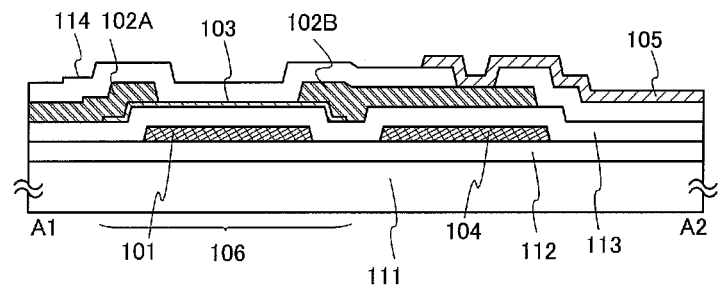

FIG. 1B illustrates a cross-sectional structure along chain line A1-A2 in FIG. 1A. In the cross-sectional structure illustrated in FIG. 1B, the first wiring 101 serving as the gate and the capacitor line 104 are provided over a substrate 111 with a base film 112 therebetween. A gate insulating film 113 is provided so as to cover the first wiring 101 and the capacitor line 104. The oxide semiconductor layer 103 is provided over the gate insulating film 113. The second wiring 102A and the third wiring 102B are provided over the oxide semiconductor layer 103. An oxide insulating layer 114 functioning as a passivation film is provided over the oxide semiconductor layer 103, the second wiring 102A, and the third wiring 102B. An opening portion is formed in the oxide insulating layer 114. The pixel electrode 105 and the third wiring 102B are connected to each other in the opening portion. A capacitor is constituted by the third wiring 102B and the capacitor line 104, using the gate insulating film 113 as a dielectric.

Figure 7:
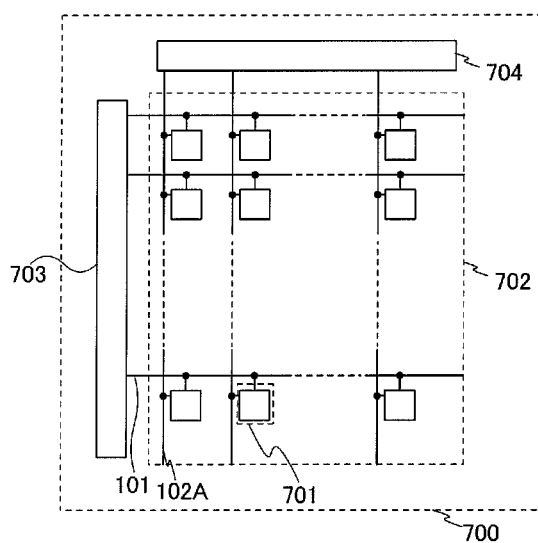
FIG. 7 is a circuit diagram of a liquid crystal display device.

Note that the pixel illustrated in FIGS. 1A and 1B is placed in a matrix as a plurality of pixels 701 over a substrate 700 as illustrated in FIG. 7. FIG. 7 illustrates a structure in which a pixel portion 702, a scan line driver circuit 703, and a signal line driver circuit 704 are placed over the substrate 700. Whether the pixels 701 are in a selected state or in a non-selected state is determined per row in accordance with a scan signal supplied from the first wiring 101 connected to the scan line driver circuit 703. The pixel 701 selected by the scan signal is supplied with a video voltage (also referred to as an image signal, a video signal, or video data) from the second wiring 102A connected to the signal line driver circuit 704.

FIG. 7 illustrates the structure in which the scan line driver circuit 703 and the signal line driver circuit 704 are provided over the substrate 700; alternatively, one of the scan line driver circuit 703 and the signal line driver circuit 704 may be provided over the substrate 700. Only the pixel portion 702 may be provided over the substrate 700.

FIG. 7 illustrates an example in which the plurality of pixels 701 are arranged in a matrix (in stripe) in the pixel portion 702. Note that the pixels 701 are not necessarily arranged in a matrix and may be arranged in a delta pattern or Bayer arrangement. As a display method of the pixel portion 702, a progressive method or an interlace method can be employed. Note that color elements controlled in the pixel for color display are not limited to three colors of R (red), G (green), and B (blue), and color elements of more than three colors may be employed, for example, RGBW (W corresponds to white), or RGB added with one or more of yellow, cyan, magenta, and the like. Further, the size of display regions may be different between dots of color elements.

FIG. 7 illustrates the first wirings 101 and the second wirings 102A corresponding to the number of pixels in the row direction and column direction. Note that the numbers of the first wirings 101 and the second wirings 102A may be increased depending on the number of sub-pixels included in one pixel or the number of transistors in the pixel. The pixels 701 may be driven with the first wiring 101 and the second wiring 102A shared with some pixels.

Note that FIG. 1A illustrates the TFT in which the second wiring 102A is rectangular; alternatively, the second wiring 102A may surround the third wiring 102B (specifically, the second wiring 102A may be U-shaped or C-shaped) so that the area of a region where carriers move is increased to increase the amount of current flowing.

Note that the width of the first wiring 101 except a region to be the thin film transistor 106 may be reduced so that the first wiring 101 is partly narrow. When the width of the first wiring is reduced, the aperture ratio of the pixel can be increased.

Note that the aperture ratio represents the area of a region through which light is transmitted, per pixel. Therefore, the aperture ratio is decreased as a region occupied by components that do not transmit light is increased, whereas the aperture ratio is increased as a region occupied by components that transmit light is increased. In a liquid crystal display device, the aperture ratio is increased by the reduction in the area occupied by a wiring and a capacitor line that overlap with a pixel, and the reduction in size of a thin film transistor.

Note that a thin film transistor is an element having at least three terminals of a gate, a drain, and a source. The thin film transistor has a channel region between a drain region and a source region, and current can flow through the drain region, the channel region, and the source region. Here, since the source and the drain of the transistor may change depending on the structure, the operating condition, and the like of the transistor, it is difficult to define which is a source or a drain. Therefore, a region functioning as a source or a drain is not called the source or the drain in some cases. In such a case, for example, one of the source and the drain is referred to as a first terminal, a first electrode, or a first region and the other of the source and the drain is referred to as a second terminal, a second electrode, or a second region in some cases.

Next, a method for manufacturing the pixel according to the top view and the cross-sectional view illustrated in FIGS. 1A and 1B will be described with reference to FIGS. 2A to 2D.

Figure 2A:
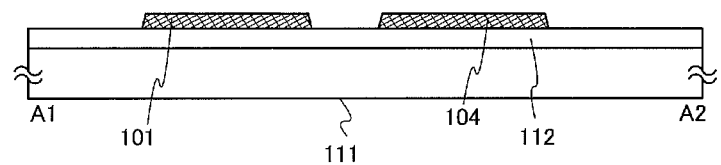
FIGS. 2A to 2D are cross-sectional views illustrating a liquid crystal display device.

A glass substrate can be used as the light-transmitting substrate 111. FIG. 2A illustrates a structure in which the base film 112 is provided over the substrate 111 in order to prevent diffusion of impurities from the substrate 111 or improve adhesion between the substrate 111 and elements provided over the substrate 111. Note that the base film 112 is not necessarily provided.

Next, a conductive layer is formed over the entire surface of the substrate 111. After that, a first photolithography step is performed so that a resist mask is formed and unnecessary portions are removed by etching, whereby the first wiring 101 and the capacitor line 104 are formed. At this time, etching is performed so that at least edges of the first wiring 101 and the capacitor line 104 are tapered. FIG. 2A is a cross-sectional view at this stage.

The first wiring 101 and the capacitor line 104 are preferably formed using a low-resistance conductive material such as aluminum (Al) or copper (Cu). Since the use of aluminum alone has disadvantages such as low heat resistance and a tendency to be corroded, aluminum is used in combination with a conductive material having heat resistance. As the conductive material having heat resistance, it is possible to use an element selected from titanium (Ti), tantalum (Ta), tungsten (W), molybdenum (Mo), chromium (Cr), neodymium (Nd), and scandium (Sc); an alloy containing any of these elements as its component an alloy containing a combination of any of these elements; or a nitride containing any of these elements as its component.

Note that the wiring and the like included in the TFT can be formed by an inkjet method or a printing method. Thus, the wiring and the like can be formed at room temperature, can be formed at a low vacuum, or can be formed using a large substrate. Since the wirings and the like can be manufactured without using a photomask, a layout of the transistor can be changed easily. Further, it is not necessary to use a resist, so that material costs are reduced and the number of steps can be reduced. In addition, a resist mask and the like can also be formed by an inkjet method or a printing method. When a resist is formed only over intended portions by an inkjet method or a printing method and exposed to light and developed to form a resist mask, costs can be reduced as compared to the case where a resist is formed over the entire surface.

A resist mask having regions with a plurality of thicknesses (typically, two kinds of thicknesses) may be formed using a multi-tone mask to form wirings and the like.

Then, an insulating film (hereinafter referred to as the gate insulating film 113) is formed over the entire surface of the first wiring 101 and the capacitor line 104. The gate insulating film 113 is formed by a sputtering method or the like.

For example, as the gate insulating film 113, a silicon oxide film is formed by a sputtering method. It is needless to say that the gate insulating film 113 is not limited to such a silicon oxide film and may be formed with a single-layer structure or a layered structure of another insulating film such as a silicon oxynitride film, a silicon nitride film, an aluminum oxide film, or a tantalum oxide film.

Note that before the deposition of an oxide semiconductor, dust attached to a surface of the gate insulating film 113 is preferably removed by reverse sputtering in which an argon gas is introduced to generate plasma. Note that a nitrogen atmosphere, a helium atmosphere, or the like may be used instead of an argon atmosphere. An argon atmosphere to which oxygen, $N_2O$, or the like is added may be used. Alternatively, an argon atmosphere to which $Cl_2$, $CF_4$, or the like is added may be used.

After the plasma treatment on the surface of the gate insulating film 113, an oxide semiconductor is deposited over the gate insulating film 113 without being exposed to the air. By the use of the oxide semiconductor for a semiconductor layer of the transistor, the field-effect mobility can be made higher than that of the case where a silicon-based semiconductor material such as amorphous silicon is used. Note that examples of the oxide semiconductor are zinc oxide (ZnO) and tin oxide ($SnO_2$). Moreover, In, Ga, or the like can be added to ZnO.

For the oxide semiconductor, a thin film represented by $InMO_3(ZnO)_x$, (x>0) can be used. Note that M denotes one or more of metal elements selected from gallium (Ga), iron (Fe), nickel (Ni), manganese (Mn), and cobalt (Co). For example, M denotes Ga in some cases; meanwhile, M denotes the above metal element such as Ni or Fe in addition to Ga (Ga and Ni or Ga and Fe) in other cases. Further, the above oxide semiconductor may contain a transitional metal element such as Fe or Ni or an oxide of the transitional metal as an impurity element in addition to the metal element contained as M. For example, an In—Ga—Zn—O-based film can be used as the oxide semiconductor layer.

As the oxide semiconductor ($InMO_3(ZnO)_x$ (x>0) film), an $InMO_3(ZnO)_x$ (x>0) film in which M is a different metal element may be used instead of the In—Ga—Zn—O-based film. Besides the above, the following oxide semiconductors can be used as the oxide semiconductor: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor.

Note that an In—Ga—Zn—O-based oxide semiconductor is used as the oxide semiconductor in this embodiment. Here, a target in which $In_2O_3$, $Ga_2O_3$, and ZnO are contained at ratio of 1:1:1 is used. The oxide semiconductor is deposited under the following conditions: the distance between the substrate and the target is 100 mm, the pressure is 0.6 Pa, the direct current (DC) power is 0.5 kW, and the atmosphere is an oxygen atmosphere (the flow rate of oxygen is 100%). Note that a pulsed direct current (DC) power supply is preferably used because powder substances (also referred to as particles or dust) generated in film deposition can be reduced and the film thickness can be uniform.

Note that a chamber used for depositing the oxide semiconductor may be the same or different from the chamber where the reverse sputtering is performed previously.

Examples of a sputtering method are an RF sputtering method in which a high-frequency power supply is used as a sputtering power supply, a DC sputtering method in which a direct-current power supply is used, and a pulsed DC sputtering method in which a bias is applied in a pulsed manner. An RF sputtering method is mainly used for forming an insulating film, and a DC sputtering method is mainly used for forming a metal film.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Further, there are a sputtering apparatus that is provided with a magnet system inside the chamber and employs a magnetron sputtering, and a sputtering apparatus employing an ECR sputtering in which plasma generated with the use of microwaves is used without using glow discharge.

Furthermore, examples of a deposition method by sputtering are a reactive sputtering method in which a target substance and a sputtering gas component chemically react with each other during deposition to form a thin compound film thereof, and a bias sputtering in which voltage is also applied to a substrate during deposition.

Next, the oxide semiconductor layer is subjected to dehydration or dehydrogenation. The temperature of first heat treatment for dehydration or dehydrogenation is higher than or equal to 400° C. and lower than 750° C., preferably higher than or equal to 425° C. and lower than 750° C. Note that the heat treatment may be performed for one hour or shorter when the temperature of the heat treatment is 425° C. or higher; the heat treatment is preferably performed for longer than one hour when the temperature is lower than 425° C. Here, the substrate is introduced into an electric furnace, which is one of heat treatment apparatuses, and heat treatment is performed on the oxide semiconductor layer in a nitrogen atmosphere. Then, the oxide semiconductor layer is not exposed to air, which prevents water or hydrogen from entering the oxide semiconductor layer, so that the oxide semiconductor layer is obtained. In this embodiment, slow cooling is performed in one furnace from the heating temperature T at which dehydration or dehydrogenation is performed on the oxide semiconductor layer to a temperature low enough to prevent entry of water; specifically, the slow cooling is performed in a nitrogen atmosphere until the temperature drops by 100° C. or more from the heating temperature T. Without being limited to a nitrogen atmosphere, dehydration or dehydrogenation may be performed in a rare gas atmosphere (e.g., helium, neon, or argon).

The heat treatment apparatus is not limited to an electric furnace and may be provided with a device that heats an object to be processed by thermal conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that hardly reacts with an object by heat treatment, for example, nitrogen or a rare gas such as argon is used.

When the oxide semiconductor layer is subjected to heat treatment at a temperature of 400° C. or higher and lower than 750° C., dehydration or dehydrogenation of the oxide semiconductor layer can be achieved; thus, water ($H_2O$) can be prevented from being contained again in the oxide semiconductor layer in a later step.

In the first heat treatment, water, hydrogen, and the like are not preferably contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (i.e., the impurity concentration is 1 ppm or lower, preferably 0.1 ppm or lower).

Note that the oxide semiconductor layer may be crystallized to be a microcrystalline film or a polycrystalline film depending on the condition of the first heat treatment or the material of the oxide semiconductor layer. For example, the oxide semiconductor layer may be crystallized to be a microcrystalline oxide semiconductor film having a degree of crystallization of 90% or more, or 80% or more. Furthermore, the oxide semiconductor layer may be an amorphous oxide semiconductor film containing no crystalline component, depending on the condition of the first heat treatment or the material of the oxide semiconductor layer.

After the first heat treatment for dehydration or dehydrogenation, the oxide semiconductor layer becomes an oxygen-deficient type and the resistance of the oxide semiconductor layer is decreased. The carrier concentration of the oxide semiconductor layer after the first heat treatment is higher than that of the oxide semiconductor film just after being deposited, and the oxide semiconductor layer preferably has a carrier concentration of $1 \times 10^{18}/cm^3$ or higher.

Figure 2B:
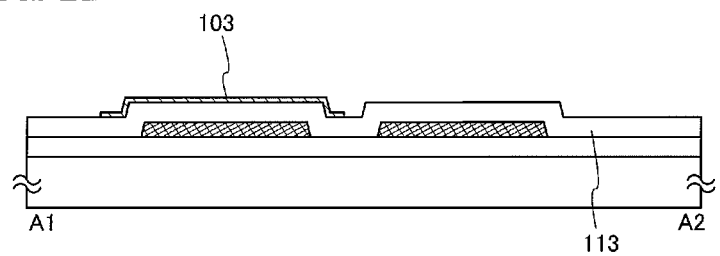

Next, a second photolithography step is performed so that a resist mask is formed and unnecessary portions are removed by etching, whereby the oxide semiconductor layer 103 formed using the oxide semiconductor is formed. The first heat treatment for the oxide semiconductor layer 103 may be performed on the oxide semiconductor film that has not yet been processed into the island-shaped oxide semiconductor layer. Wet etching or dry etching is employed as an etching method at this time. FIG. 2B is a cross-sectional view at this stage.

Then, a conductive film is formed from a metal material over the oxide semiconductor layer by a sputtering method or a vacuum evaporation method. Examples of a material for the conductive film are an element selected from Al, Cr, Ta, Ti, Mo, and W; an alloy containing any of the above elements as its component; and an alloy containing a combination of any of the above elements. Further, in the case where heat treatment at 200° C. to 600° C. is performed, the conductive film preferably has heat resistance for such heat treatment. Since the use of Al alone brings disadvantages such as low heat resistance and a tendency to be corroded, aluminum is used in combination with a conductive material having heat resistance. As the conductive material having heat resistance which is used in combination with Al, any of the following materials can be used: an element selected from titanium (Ti), tantalum (Ta), tungsten (W), molybdenum (Mo), chromium (Cr), neodymium (Nd), and scandium (Sc); an alloy containing any of these above elements as a component; an alloy containing these elements in combination; and a nitride containing any of these above elements as a component.

Here, the conductive film has a single-layer structure of a titanium film. The conductive film may have a two-layer structure, and a titanium film may be stacked over an aluminum film. Alternatively, the conductive film may have a three-layer structure in which a Ti film, an aluminum film containing Nd (an Al—Nd film), and a Ti film are stacked in this order. The conductive film may have a single-layer structure of an aluminum film containing silicon.

Figure 2C:
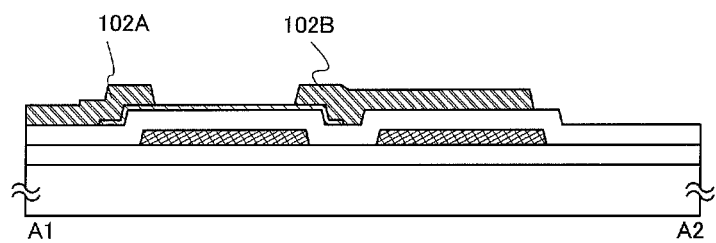

Next, a third photolithography step is performed so that a resist mask is formed and unnecessary portions are removed by etching, whereby the second wiring 102A and the third wiring 102B made of the conductive film are formed. Wet etching or dry etching is employed as an etching method at this time. For example, when a conductive film of Ti is etched with wet etching using an ammonia peroxide mixture (hydrogen peroxide of 31 wt %:ammonia of 28 wt %:water=5:2:2), the oxide semiconductor layer 103 can be left while the second wiring 102A and the third wiring 102B are partly etched. FIG. 2C is a cross-sectional view at this stage.

An exposed region of the oxide semiconductor layer is sometimes etched in the third photolithography step depending on the etching conditions. In this case, the thickness of the oxide semiconductor layer 103 in a region between the second wiring 102A and the third wiring 102B is smaller than that of the first oxide semiconductor layer 103 over the first wiring 101 in a region overlapping with the second wiring 102A or the third wiring 102B.

Then, the oxide insulating layer 114 is formed over the gate insulating film 113, the oxide semiconductor layer 103, the second wiring 102A, and the third wiring 102B. At this stage, part of the oxide semiconductor layer 103 is in contact with the oxide insulating layer 114. Note that a region of the oxide semiconductor layer 103 that overlaps with the first wiring 101 with the gate insulating film 113 therebetween serves as a channel formation region.

The oxide insulating layer 114 can be formed to a thickness of at least 1 nm by a method with which impurities such as water or hydrogen are not mixed into the oxide insulating layer, such as a sputtering method, as appropriate. In this embodiment, a silicon oxide film is formed by a sputtering method as the oxide insulating layer. The substrate temperature in film formation is higher than or equal to room temperature and lower than or equal to 300° C., and is 100° C. in this embodiment. The silicon oxide film can be formed by a sputtering method in a rare gas (typically, argon) atmosphere, an oxygen atmosphere, or a mixed atmosphere of a rare gas (typically, argon) and oxygen. As a target, a silicon oxide target or a silicon target can be used. For example, with the use of a silicon target, a silicon oxide film can be formed by a sputtering method in an atmosphere of oxygen and a rare gas. As the oxide insulating layer which is formed in contact with the oxide semiconductor layer whose resistance is reduced, an inorganic insulating film that does not include impurities such as moisture, a hydrogen ion, and OH⁻ and blocks entry of these impurities from the outside is used. Specifically, a silicon oxide film, a silicon nitride oxide film, an aluminum oxide film, or an aluminum oxynitride film is used. Note that an oxide insulating layer formed by a sputtering method is particularly dense and even a single layer of the oxide insulating layer can be used as a protective film for preventing diffusion of impurities into a layer in contact therewith. A target doped with phosphorus (P) or boron (B) can be used so that phosphorus (P) or boron (B) is added to the oxide insulating layer.

In this embodiment, the oxide insulating layer 114 is formed by a pulsed DC sputtering method using a columnar polycrystalline, boron-doped silicon target that has a purity of 6N and a resistivity of 0.01 Ωcm in the following conditions: the distance between the substrate and the target (T-S distance) is 89 mm, the pressure is 0.4 Pa, the direct-current (DC) power supply is 6 kW, and the atmosphere is oxygen (the oxygen flow rate is 100%). The thickness of the oxide insulating layer 114 is 300 nm.

Note that the oxide insulating layer 114 is provided on and in contact with a region serving as the channel formation region of the oxide semiconductor layer and also functions as a channel protective layer.

Next, second heat treatment (preferably at 200° C. to 400° C., for example, 250° C. to 350° C.) may be performed in an inert gas atmosphere or a nitrogen atmosphere. For example, the second heat treatment is performed at 250° C. for one hour in a nitrogen atmosphere. By the second heat treatment, heat is applied while part of the oxide semiconductor layer 103 is in contact with the oxide insulating layer 114.

When the second heat treatment is performed while the oxide semiconductor layer 103, the resistance of which is reduced by the first heat treatment, is in contact with the oxide insulating layer 114, a region that is in contact with the oxide insulating layer 114 becomes deficient in oxygen. Thus, the region in the oxide semiconductor layer 103 in contact with the oxide insulating layer 114 becomes an i-type region (i.e., the resistance of the region is increased) toward the depth direction of the oxide semiconductor layer 103.

Then, an opening portion 121 is formed in the oxide insulating layer 114 by a fourth photolithography method, and a light-transmitting conductive film is formed. The light-transmitting conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Alternatively, an Al—Zn—O-based film containing nitrogen, that is, an Al—Zn—O—N-based film, a Zn—O-based film containing nitrogen, or a Sn—Zn—O-based film containing nitrogen may be used. Note that the composition ratio (atomic %) of zinc in the Al—Zn—O—N-based film is less than or equal to 47 atomic % and is higher than that of aluminum in the film; the composition ratio (atomic %) of aluminum in the film is higher than that of nitrogen in the film. Such a material is etched with a hydrochloric acid-based solution. However, since a residue is easily generated particularly in etching ITO, an alloy of indium oxide and zinc oxide ($In_2O_3$—ZnO) may be used to improve etching processability.

Note that the unit of the percentage of components in the light-transmitting conductive film is atomic percent (atomic %), and the percentage of components is evaluated by analysis using an electron probe X-ray microanalyzer (EPMA).

Figure 2D:
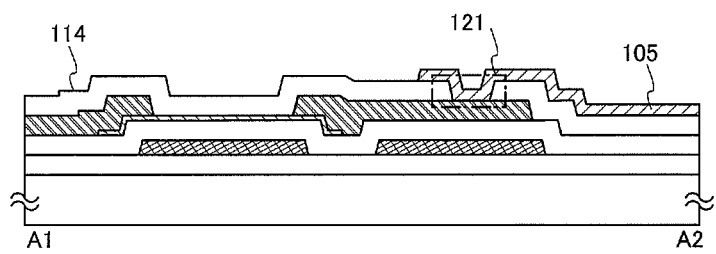

Next, a fifth photolithography step is performed so that a resist mask is formed and unnecessary portions are removed by etching, thereby forming the pixel electrode 105. FIG. 2D is a cross-sectional view at this stage.

In such a manner, the pixel including the thin film transistor 106 can be manufactured. Moreover, the pixels are arranged in a matrix to form a pixel portion, whereby one of substrates for manufacturing an active-matrix liquid crystal display device can be obtained. In this specification, such a substrate is referred to as an active-matrix substrate for convenience.

Note that in an active-matrix liquid crystal display device, pixel electrodes arranged in a matrix are driven so that a display pattern is formed on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer. A display element such as a liquid crystal element is provided over the pixel electrode 105.

Advantages of the structure in this embodiment illustrated in FIGS. 1A and 1B and FIGS. 2A to 2D will be described in detail with reference to FIGS. 3A and 3B.

Figure 3A:
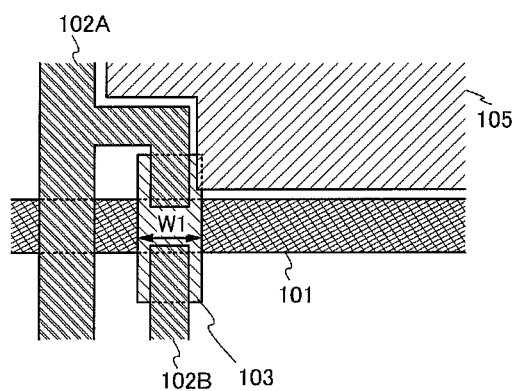
FIGS. 3A and 3B are top views each illustrating a liquid crystal display device.
Figure 3B:
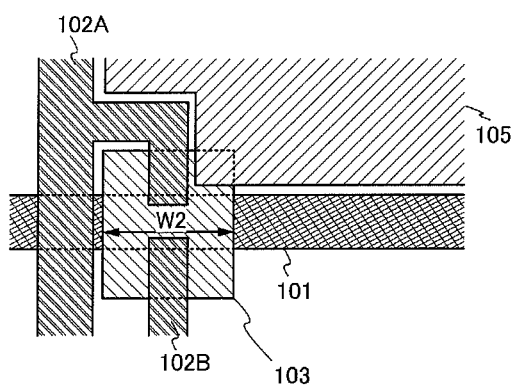

FIGS. 3A and 3B are each a magnified view of the vicinity of the oxide semiconductor layer in the top view in FIG. 1A. A diagram in which the width (W1 in FIG. 3A) of the oxide semiconductor layer 103 in FIG. 3A is increased corresponds to FIG. 3B illustrating the width (W2 in FIG. 3B) of the oxide semiconductor layer 103.

As illustrated in FIGS. 3A and 3B, the oxide semiconductor layer 103 in the top view of the pixel in FIG. 1A of this embodiment is provided over the first wiring 101 without separating another wiring from the first wiring 101. A channel region formed in the oxide semiconductor layer between the second wiring 102A and the third wiring 102B is formed in a region overlapping the first wiring 101. Since characteristics of the TFT might vary when light is emitted to the channel region, the oxide semiconductor layer 103 needs to be well shielded from light by a wiring separated from the first wiring 101, which results in a reduction in aperture ratio of the pixel. In contrast, the aperture ratio can be increased with the structure in this embodiment, in which the oxide semiconductor layer is provided so as to overlap the first wiring 101 and a wiring separated from the first wiring 101 is not formed. Moreover, by using a light-transmitting oxide semiconductor layer as the semiconductor layer of the thin film transistor, display can be performed without a reduction in aperture ratio even if the oxide semiconductor layer is shifted from an intended region overlapping with the first wiring 101 and thus overlaps with the pixel electrode 105.

When the oxide semiconductor layer is formed with a pattern larger than a predetermined size, favorable display can be performed without a malfunction and a reduction in aperture ratio even if the oxide semiconductor layer is formed in a portion that is slightly shifted from the intended position. An active-matrix substrate for the liquid crystal display device can be easily manufactured, and the yield can be increased.

As described above, the structure described in this embodiment makes it possible to increase the aperture ratio of a pixel including a thin film transistor in which an oxide semiconductor is used. Thus, a liquid crystal display device can include a high definition display portion.

This embodiment can be implemented in combination with any of the structures described in the other embodiments as appropriate.

Embodiment 2

An example in which a pixel in a display device includes a TFT having a structure different from that in Embodiment 1 will be described below.

Figure 4A:
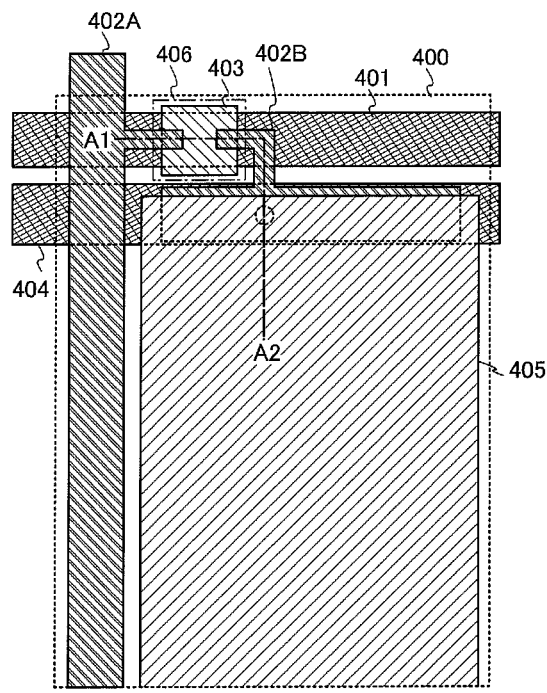
FIGS. 4A and 4B are a top view and a cross-sectional view of a liquid crystal display device.

FIG. 4A is a top view of a pixel having a structure different from that in Embodiment 1. A TFT illustrated in FIG. 4A is a kind of bottom-gate structure called an inverted staggered structure in which a wiring layer serving as a source electrode and a drain electrode of the TFT is placed opposite to an oxide semiconductor layer serving as a channel region, with respect to a wiring serving as a gate.

A pixel 400 illustrated in FIG. 4A includes a first wiring 401 functioning as a scan line, a second wiring 402A functioning as a signal line, an oxide semiconductor layer 403, a capacitor line 404, and a pixel electrode 405. Moreover, the pixel 400 includes a third wiring 402B for electrically connecting the oxide semiconductor layer 403 and the pixel electrode 405, so that a thin film transistor 406 is formed. The first wiring 401 also functions as a gate of the thin film transistor 406. The second wiring 402A also functions as one of a source electrode and a drain electrode of the thin film transistor 406. The third wiring 402B also functions as the other of the source electrode and the drain electrode of the thin film transistor 406 and one electrode of a storage capacitor. The capacitor line 404 is a wiring functioning as the other electrode of the storage capacitor.

Note that the first wiring 401 and the capacitor line 404 are formed from the same layer; the second wiring 402A and the third wiring 402B are formed from the same layer. In addition, the third wiring 402B and the capacitor line 404 partly overlap with each other to form the storage capacitor of the liquid crystal element. Note that the oxide semiconductor layer 403 included in the thin film transistor 406 is provided over the first wiring 401 with a gate insulating film (not illustrated) therebetween, and extended beyond the edge of a region where the first wiring 401 is provided.

Figure 4B:
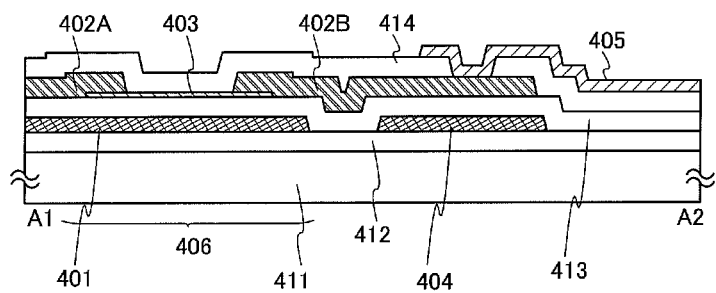

FIG. 4B illustrates a cross-sectional structure along chain line A1-A2 in FIG. 4A. In the cross-sectional structure illustrated in FIG. 4B, the first wiring 401 serving as the gate and the capacitor line 404 are provided over a substrate 411 with a base film 412 therebetween. A gate insulating film 413 is provided so as to cover the first wiring 401 and the capacitor line 404. The oxide semiconductor layer 403 is provided over the gate insulating film 413. The second wiring 402A and the third wiring 402B are provided over the oxide semiconductor layer 403. An oxide insulating layer 414 functioning as a passivation film is provided over the oxide semiconductor layer 403, the second wiring 402A, and the third wiring 402B. An opening portion is formed in the oxide insulating layer 414. The pixel electrode 405 and the third wiring 402B are connected in the opening portion. A capacitor is constituted by the third wiring 402B and the capacitor line 404, using the gate insulating film 413 as a dielectric.

Note that as in the description of FIGS. 1A and 1B in Embodiment 1, the pixel illustrated in FIGS. 4A and 4B is placed over the substrate 700 in FIG. 7 as the plurality of pixels 701 arranged in a matrix. The description of FIG. 7 is similar to that in Embodiment 1.

Moreover, the cross-sectional view in FIG. 4B is similar to the cross-sectional view in FIG. 1B, and the description of a method for forming a pixel is similar to the description of FIGS. 2A to 2D in Embodiment 1.

Advantages of the structure in this embodiment illustrated in FIGS. 4A and 4B will be described in detail with reference to FIGS. 5A and 5B.

Figure 5A:
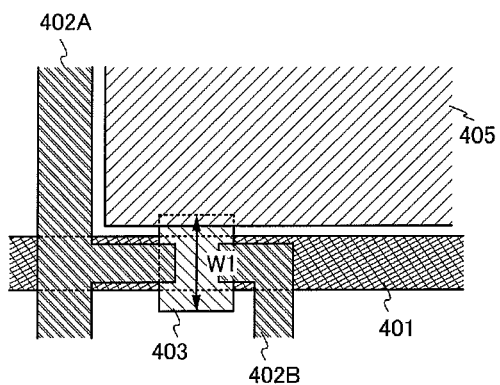
FIGS. 5A and 5B are top views each illustrating a liquid crystal display device.
Figure 5B:
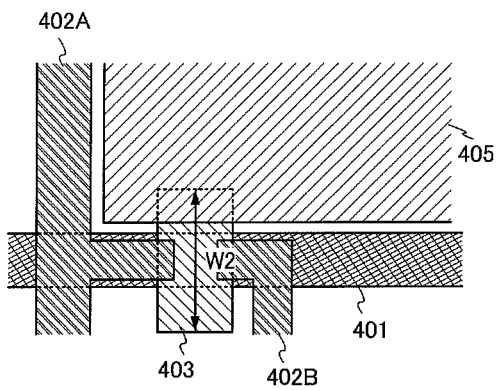

FIGS. 5A and 5B are each a magnified view of the vicinity of the oxide semiconductor layer in the top view in FIG. 4A. A diagram in which the width (W1 in FIG. 5A) of the oxide semiconductor layer 403 in FIG. 5A is increased corresponds to FIG. 5B illustrating the width (W2 in FIG. 5B) of the oxide semiconductor layer 403.

As illustrated in FIGS. 5A and 5B, the oxide semiconductor layer 403 in the top view of the pixel in FIG. 4A of this embodiment is provided over the first wiring 401 without separating another wiring from the first wiring 401. A channel region formed in the oxide semiconductor layer between the second wiring 402A and the third wiring 402B is formed in a region overlapping the first wiring 401. In addition, the oxide semiconductor layer 403 in this embodiment is extended over the gate insulating film over the first wiring 401 and is in contact with the second wiring 402A and the third wiring 402B. Since characteristics of the TFT might vary when light is emitted to the channel region, the oxide semiconductor layer 403 needs to be well shielded from light by a wiring separated from the first wiring 401, which results in a reduction in aperture ratio of the pixel. In contrast, the aperture ratio can be increased with the structure in this embodiment, in which the oxide semiconductor layer is provided so as to overlap the first wiring 401 and a wiring separated from the first wiring 401 is not formed; and the second wiring 402A and the third wiring 402B are extended over the gate insulating film over the first wiring 401 so as to be in contact with the oxide semiconductor layer 403. Moreover, by using a light-transmitting oxide semiconductor layer as the semiconductor layer of the thin film transistor, display can be performed without a reduction in aperture ratio even if the oxide semiconductor layer is shifted from an intended region overlapping with the first wiring 401 and thus overlaps with the pixel electrode 405.

Note that the second wiring 402A and the third wiring 402B extended over the first wiring 401 illustrated in FIG. 4A overlaps the first wiring 401. The second wiring 402A and the third wiring 402B may be placed in a meander pattern or may be provided linearly.

When the oxide semiconductor layer is formed with a pattern larger than a predetermined size, favorable display can be performed without a malfunction and a reduction in aperture ratio even if the oxide semiconductor layer is formed in a portion that is slightly shifted from the intended position. An active-matrix substrate for the liquid crystal display device can be easily manufactured, and the yield can be increased.

As described above, the structure in this embodiment makes it possible to increase the aperture ratio of a pixel including a thin film transistor in which an oxide semiconductor is used. Thus, a liquid crystal display device can include a high definition display portion.

This embodiment can be implemented in combination with any of the structures described in the other embodiments as appropriate.

Embodiment 3

An example in which a pixel in a display device includes a TFT having a structure different from those in Embodiments 1 and 2 will be described below.

Figure 6A:
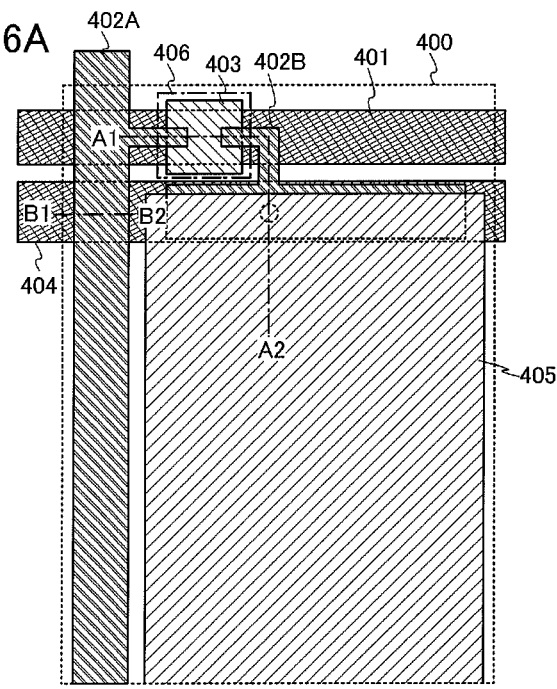
FIGS. 6A to 6C are a top view and cross-sectional views of a liquid crystal display device.
Figure 6B:
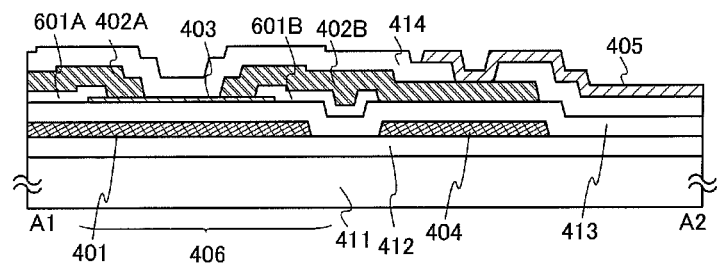
Figure 6C:
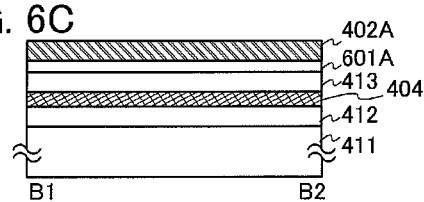

FIGS. 6A to 6C are a top view and cross-sectional views of a pixel that has a structure different from that in Embodiment 2. Note that the structure in the top view of FIG. 6A is similar to that of FIG. 4A; therefore, the description is not repeated. The structure in the cross-sectional view of FIG. 6B is different from the structure in the cross-sectional view of FIG. 4B in that an insulating layer 601A is provided between the first wiring 401 and the second wiring 402A, and that an insulating layer 601B is provided between the first wiring 401 and the third wiring 402B. FIG. 6C is a cross-sectional view along dashed line B1-B2 in FIG. 6A and illustrates a structure in which the insulating layer 601A is placed between the capacitor line 404 and the second wiring 402A.

When the second wiring 402A and the third wiring 402B are extended over the first wiring 401 and the capacitor line 404, parasitic capacitance might be generated between the first wiring 401 and the second wiring 402A, between the first wiring 401 and the third wiring 402B, and between the capacitor line 404 and the second wiring 402A, depending on the thickness of the gate insulating film 413. The insulating layers 601A and 601B are provided as illustrated in FIGS. 6B and 6C, whereby the parasitic capacitance can be reduced and defects such as a malfunction can be reduced.

As described above, the structure described in this embodiment makes it possible to increase the aperture ratio of a pixel including a thin film transistor in which an oxide semiconductor is used. Moreover, in this embodiment, it is possible to achieve the reduction in parasitic capacitance in addition to the advantages in Embodiment 2. Thus, it is possible to provide a liquid crystal display device in which a malfunction is less likely to occur and which includes a high definition display portion.

Embodiment 4

In this embodiment, a structure and operation of a pixel that can be applied to a liquid crystal display device will be described.

Figure 8A:
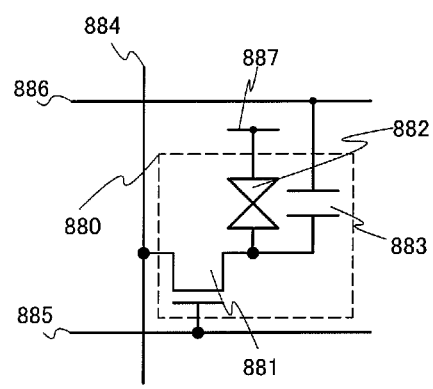
FIGS. 8A and 8B are circuit diagrams each illustrating a liquid crystal display device.

FIG. 8A illustrates an example of a pixel configuration that can be applied to a liquid crystal display device. A pixel 880 includes a transistor 881, a liquid crystal element 882, and a capacitor 883. A gate of the transistor 881 is electrically connected to a wiring 885. A first terminal of the transistor 881 is electrically connected to a wiring 884. A second terminal of the transistor 881 is electrically connected to a first terminal of the liquid crystal element 882. A second terminal of the liquid crystal element 882 is electrically connected to a wiring 887. A first terminal of the capacitor 883 is electrically connected to the first terminal of the liquid crystal element 882. A second terminal of the capacitor 883 is electrically connected to a wiring 886.

The wiring 884 can function as a signal line. The signal line is a wiring for transmitting a signal voltage, which is input from the outside of the pixel, to the pixel 880. The wiring 885 can function as a scan line. The scan line is a wiring for controlling on/off of the transistor 881. The wiring 886 can function as a capacitor line. The capacitor line is a wiring for applying a predetermined voltage to the second terminal of the capacitor 883. The transistor 881 can function as a switch. The capacitor 883 can function as a storage capacitor. The storage capacitor is a capacitor with which the signal voltage continues to be applied to the liquid crystal element 882 even when the switch is off. The wiring 887 can function as a counter electrode. The counter electrode is a wiring for applying a predetermined voltage to the second terminal of the liquid crystal element 882. Note that a function of each wiring is not limited to the above, and each wiring can have a variety of functions. For example, by changing a voltage applied to the capacitor line, a voltage applied to the liquid crystal element can be adjusted.

Figure 8B:
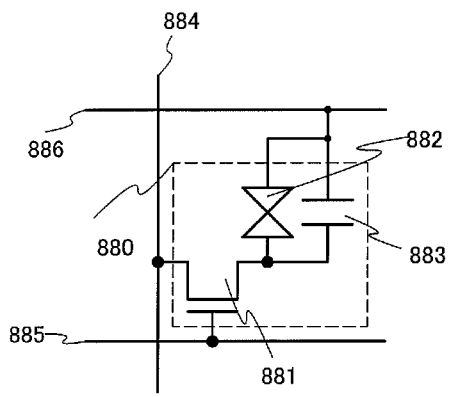

FIG. 8B illustrates an example of a pixel configuration that can be applied to a liquid crystal display device. The example of the pixel configuration in FIG. 8B is the same as that in FIG. 8A, except that the wiring 887 is eliminated and the second terminal of the liquid crystal element 882 and the second terminal of the capacitor 883 are electrically connected to each other. The example of the pixel configuration in FIG. 8B can be applied particularly to the case of using a liquid crystal element with a horizontal electric field mode (including an IPS mode and FFS mode). This is because in the horizontal electric field mode liquid crystal element, the second terminal of the liquid crystal element 882 and the second terminal of the capacitor 883 can be formed over one substrate, and thus it is easy to electrically connect the second terminal of the liquid crystal element 882 and the second terminal of the capacitor 883. With the pixel configuration in FIG. 8B, the wiring 887 can be eliminated, whereby a manufacturing process can be simplified and manufacturing costs can be reduced.

Figure 9A:
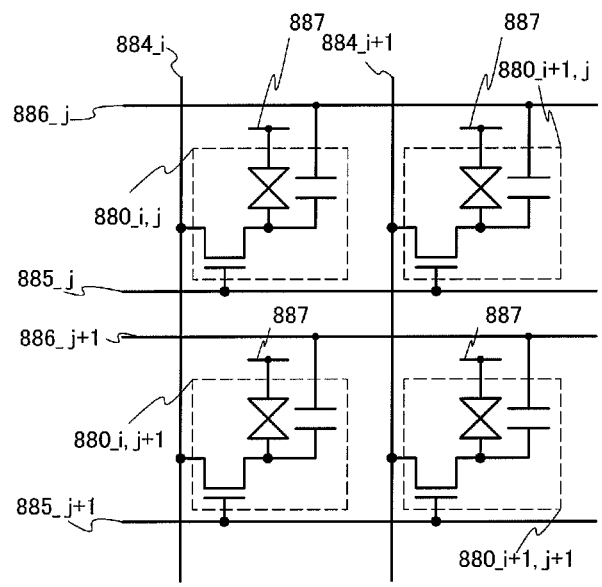
FIGS. 9A and 9B are a circuit diagram and a timing chart illustrating a liquid crystal display device.

A plurality of pixels with the structure illustrated in FIG. 8A or FIG. 8B can be arranged in a matrix. Thus, a display portion of the liquid crystal display device is formed, and a variety of images can be displayed. FIG. 9A illustrates a circuit configuration in the case where a plurality of pixels with the structure illustrated in FIG. 8A are arranged in a matrix. FIG. 9A is a circuit diagram illustrating four pixels among a plurality of pixels included in the display portion. A pixel placed in an ith column and a jth row (i and j are each a natural number) is represented as a pixel 880_$i,j$, and a wiring 884_$i$, a wiring 885_$j$, and a wiring 886_$j$ are electrically connected to the pixel 880_$i,j$. Similarly, a pixel 880_$i+1,j$ is electrically connected to a wiring 884_$i+1$, the wiring 885_$j$, and the wiring 886_$j$. Similarly, a pixel 880_$i,j+1$ is electrically connected to the wiring 884_$i$, a wiring 885_$j+1$, and a wiring 886_$j+1$. Similarly, a pixel 880_$i+1,j+1$ is electrically connected to the wiring 884_$i+1$, the wiring 885_$j+1$, and the wiring 886_$j+1$. Note that each of the wirings can be shared with a plurality of pixels in one column or one row. In the pixel configuration illustrated in FIG. 9A, the wiring 887 is a counter electrode. Since the counter electrode is common to all the pixels, the wiring 887 is not indicated by the natural number i or j. Further, since the pixel configuration in FIG. 8B can also be used, the wiring 887 is not essential even in a structure where the wiring 887 is provided, and the wiring 887 can be omitted when another wiring serves as the wiring 887, for example.

Figure 9B:
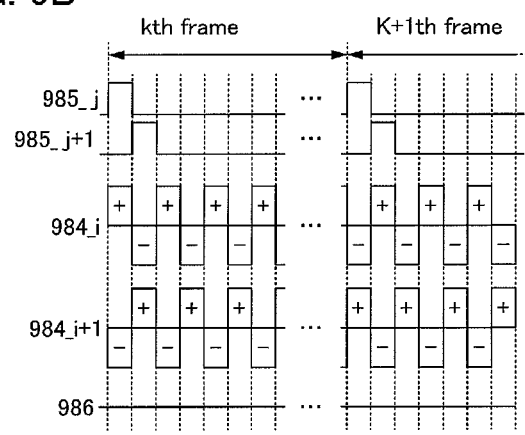

The pixel configuration in FIG. 9A can be driven by a variety of methods. In particular, when the pixels are driven by a method called alternating-current driving, degradation (burn-in) of the liquid crystal element can be suppressed. FIG. 9B is a timing chart of voltages applied to each wiring in the pixel configuration in FIG. 9A in the case where dot inversion driving which is a kind of alternating-current driving is performed. By the dot inversion driving, flickers seen when the alternating-current driving is performed can be suppressed. Note that FIG. 9B illustrates a signal 985_$j$ input to the wiring 885_$j$, a signal 985_$j+1$ input to the wiring 885_$j+1$, a signal 984_$i$ input to the wiring 884_$i$, a signal 984_$i+1$ input to the wiring 884_$i+1$, and a voltage 986 supplied to the wiring 886.

In the pixel configuration in FIG. 9A, a switch in a pixel electrically connected to the wiring 885_$j$ is brought into a selection state (an on state) in a jth gate selection period in one frame period, and brought into a non-selection state (an off state) in the other periods. Then, a (j+1)th gate selection period is provided after the jth gate selection period. By performing sequential scanning in this manner, all the pixels are sequentially selected in one frame period. In the timing chart in FIG. 9B, the switch in the pixel is brought into a selection state when the voltage is set to high level, and the switch is brought into a non-selection state when the voltage is set to low level.

In the timing chart in FIG. 9B, in the jth gate selection period in a kth frame (k is a natural number), a positive signal voltage is applied to the wiring 884_$i$ used as a signal line, and a negative signal voltage is applied to the wiring 884_$i+1$. Then, in the (j+1)th gate selection period in the kth frame, a negative signal voltage is applied to the wiring 884_$i$, and a positive signal voltage is applied to the wiring 884_$i+1$. After that, signals whose polarity is reversed in each gate selection period are alternately supplied to each of the signal lines. Thus, in the kth frame, the positive signal voltage is applied to the pixel 880_$i,j$ and the pixel 880_$i+1,j+1$, and the negative signal voltage is applied to the pixel 880_$i+1,j$ and the pixel 880_$i,j+1$. Then, in a (k+1)th frame, a signal voltage whose polarity is opposite to that of the signal voltage written in the kth frame is written to each pixel. Thus, in the (k+1)th frame, the positive signal voltage is applied to the pixel 880_$i+1,j$ and the pixel 880_$i+1,j+1$, and the negative signal voltage is applied to the pixel 880_$i,j$ and the pixel 880_$i+1,j+1$. The dot inversion driving is a driving method in which signal voltages whose polarity is different between adjacent pixels are applied in one frame and the polarity of the voltage signal for one pixel is reversed in each frame as described above. By the dot inversion driving, flickers seen when the entire or part of an image to be displayed is uniform can be suppressed while degradation of the liquid crystal element is suppressed. Note that voltages applied to all the wirings 886 including the wiring 886_$j$ and the wiring 886_$j+1$ can be a fixed voltage. Moreover, although only the polarity of the signal voltages for the wirings 884 is shown in the timing chart, the signal voltages can actually have a variety of values in the polarity shown. Here, the case where the polarity is reversed per dot (per pixel) is described; the polarity can be reversed per a plurality of pixels without limitation to the above. For example, when the polarity of signal voltages to be written is reversed per two gate selection periods, power consumed by writing the signal voltages can be reduced. Alternatively, the polarity can be reversed per column (source line inversion) or per row (gate line inversion).

Figure 10A:
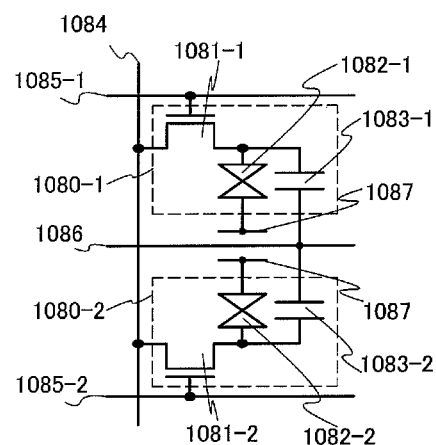
FIGS. 10A and 10B are circuit diagrams each illustrating a liquid crystal display device.
Figure 10B:
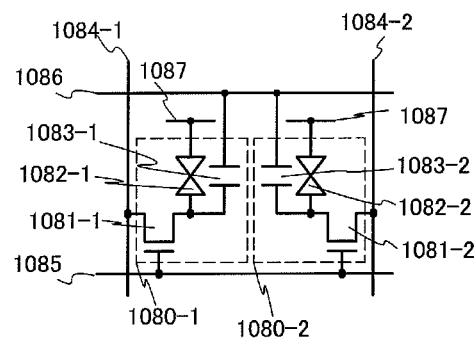

Next, a pixel configuration and a driving method that are preferably used particularly by a liquid crystal element with a vertical alignment (VA) mode typified by an MVA mode or a PVA mode will be described. The VA mode has advantages that a rubbing process is not necessary in manufacturing, the amount of light leakage is small in displaying black images, and the level of drive voltage is low; however, the VA mode has a problem in that the quality of images deteriorates when a screen is viewed from an angle (i.e., the viewing angle is small). In order to increase the viewing angle in the VA mode, a pixel configuration in which one pixel includes a plurality of subpixels as illustrated in FIGS. 10A and 10B is effective. Pixel configurations illustrated in FIGS. 10A and 10B are examples of the case where a pixel 1080 includes two subpixels (a first subpixel 1080-1 and a second subpixel 1080-2). Note that the number of subpixels in one pixel is not limited to two and can be other numbers. As the number of subpixels becomes larger, the viewing angle can be further increased. A plurality of subpixels can have the same circuit configuration. Here, the case is described in which all the subpixels have the circuit configuration in FIG. 8A. The first subpixel 1080-1 includes a transistor 1081-1, a liquid crystal element 1082-1, and a capacitor 1083-1. The connection relation is the same as that in the circuit configuration in FIG. 8A. Similarly, the second subpixel 1080-2 includes a transistor 1081-2, a liquid crystal element 1082-2, and a capacitor 1083-2. The connection relation is the same as that in the circuit configuration in FIG. 8A.

The pixel configuration in FIG. 10A includes, for two subpixels included in one pixel, two wirings 1085 (a wiring 1085-1 and a wiring 1085-2) used as scan lines, one wiring 1084 used as a signal line, and one wiring 1086 used as a capacitor line. When the signal line and the capacitor line are shared with two subpixels in such a manner, the aperture ratio can be increased. Further, a signal line driver circuit can be simplified, so that manufacturing costs can be reduced. Moreover, the number of connections between a liquid crystal panel and a driver circuit IC can be reduced, so that the yield can be increased. The pixel configuration in FIG. 10B includes, for two subpixels included in one pixel, one wiring 1085 used as a scan line, two wirings 1084 (a wiring 1084-1 and a wiring 1084-2) used as signal lines, and one wiring 1086 used as a capacitor line. When the scan line and the capacitor line are shared with two subpixels in such a manner, the aperture ratio can be increased. Further, the total number of scan lines can be reduced, so that one gate line selection period per pixel can be sufficiently long even in a high-definition liquid crystal panel, and an appropriate signal voltage can be written in each pixel.

Figure 11A:
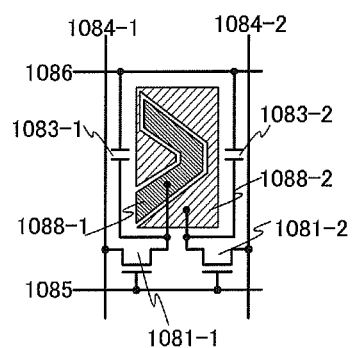
FIGS. 11A and 11B are circuit diagrams each illustrating a liquid crystal display device.
Figure 11B:
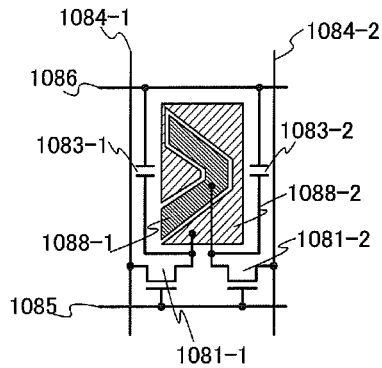

FIGS. 11A and 11B each schematically illustrate an example of electrical connection of elements in the case where the liquid crystal element in the pixel configuration in FIG. 10B is replaced with the shape of a pixel electrode. In FIGS. 11A and 11B, an electrode 1088-1 represents a first pixel electrode, and an electrode 1088-2 represents a second pixel electrode. In FIG. 11A, the first pixel electrode 1088-1 corresponds to a first terminal of the liquid crystal element 1082-1 in FIG. 10B, and the second pixel electrode 1088-2 corresponds to a first terminal of the liquid crystal element 1082-2 in FIG. 10B. That is, the first pixel electrode 1088-1 is electrically connected to one of a source and a drain of the transistor 1081-1, and the second pixel electrode 1088-2 is electrically connected to one of a source and a drain of the transistor 1081-2. In FIG. 11B, the connection relation between the pixel electrode and the transistor is opposite to that in FIG. 11A. That is, the first pixel electrode 1088-1 is electrically connected to one of the source and the drain of the transistor 1081-2, and the second pixel electrode 1088-2 is electrically connected to one of the source and the drain of the transistor 1081-1.

A combination of the pixel in this embodiment with the structure in any of Embodiments 1 to 3 makes it possible to increase the aperture ratio of the pixel including a thin film transistor in which an oxide semiconductor is used.

This embodiment can be implemented in combination with any of the structures described in the other embodiments as appropriate.

Embodiment 5

In this embodiment, an example of an electronic device including the liquid crystal display device described in any of Embodiments 1 to 4 will be described.

Figure 12A:
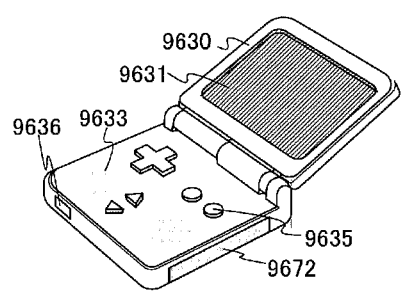
FIGS. 12A to 12C each illustrate an electronic device.

FIG. 12A illustrates a portable game machine that can include a housing 9630, a display portion 9631, a speaker 9633, operation keys 9635, a connection terminal 9636, a recording medium insert reading portion 9672, and the like. The portable game machine in FIG. 12A has a function of reading a program or data stored in the recording medium to display it on the display portion, a function of sharing information with another portable game machine by wireless communication, and the like. Note that the portable game machine in FIG. 12A can have a variety of functions without being limited to the above.

Figure 12B:
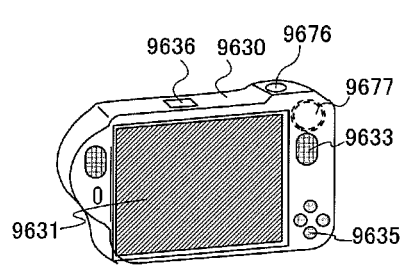

FIG. 12B illustrates a digital camera that can include the housing 9630, the display portion 9631, the speaker 9633, the operation keys 9635, the connection terminal 9636, a shutter button 9676, an image receiving portion 9677, and the like. The digital camera having a television reception function in FIG. 12B has various functions such as a function of photographing a still image and/or a moving image; a function of automatically or manually correcting the photographed image; a function of obtaining various kinds of information from an antenna; and a function of displaying the photographed image or the information obtained from the antenna on the display portion. Note that the digital camera having the television reception function in FIG. 12B can have a variety of functions without being limited to the above.

Figure 12C:
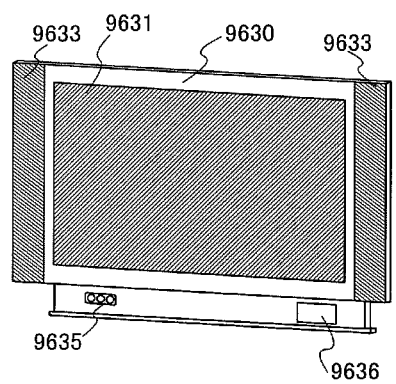

FIG. 12C illustrates a television set that can include the housing 9630, the display portion 9631, the speakers 9633, the operation key 9635, the connection terminal 9636, and the like. The television set in FIG. 12C has a function of converting an electric wave for television into an image signal, a function of converting the image signal into a signal suitable for display, a function of converting a frame frequency of the image signal, and the like. Note that the television set in FIG. 12C can have a variety of functions without being limited to the above.

Figure 13A:
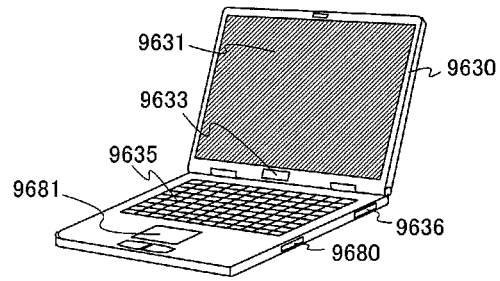
FIGS. 13A to 13C each illustrate an electronic device.

FIG. 13A illustrates a computer that can include the housing 9630, the display portion 9631, the speaker 9633, the operation keys 9635, the connection terminal 9636, a pointing device 9681, an external connection port 9680, and the like. The computer in FIG. 13A can have a function of displaying a variety of information (e.g., a still image, a moving image, and a text image) on the display portion, a function of controlling processing by a variety of software (programs), a communication function such as wireless communication or wired communication, a function of being connected to various computer networks with the communication function, a function of transmitting or receiving a variety of data with the communication function, and the like. Note that the computer in FIG. 13A is not limited to having these functions and can have a variety of functions.

Figure 13B:
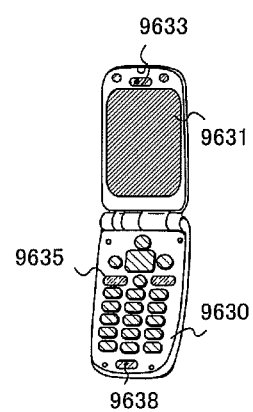

FIG. 13B illustrates a mobile phone that can include the housing 9630, the display portion 9631, the speaker 9633, the operation keys 9635, a microphone 9638, and the like. The mobile phone in FIG. 13B can have a function of displaying a variety of information (e.g., a still image, a moving image, and a text image) on the display portion; a function of displaying a calendar, a date, the time, or the like on the display portion; a function of operating or editing the information displayed on the display portion; a function of controlling processing by various kinds of software (programs); and the like. Note that the functions of the mobile phone in FIG. 13B are not limited to those described above, and the mobile phone can have various functions.

Figure 13C:
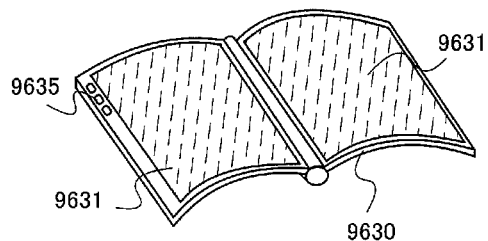

FIG. 13C illustrates an electronic device including electronic paper (also referred to as an eBook or an e-book reader) that can include the housing 9630, the display portion 9631, the operation key 9635, and the like. The e-book reader in FIG. 13C can have a function of displaying a variety of information (e.g., a still image, a moving image, and a text image) on the display portion; a function of displaying a calendar, a date, the time, and the like on the display portion; a function of operating or editing the information displayed on the display portion; a function of controlling processing by various kinds of software (programs); and the like. Note that the e-book reader in FIG. 13C can have a variety of functions without being limited to the above.

In the electronic device described in this embodiment, the aperture ratio of a plurality of pixels included in the display portion can be increased.

This embodiment can be implemented in combination with any of the structures described in the other embodiments as appropriate.

Example 1

This example shows an estimate of how much the aperture ratio of each pixel in a liquid crystal display device is increased by using a thin film transistor including an oxide semiconductor layer, and the result of the estimate.

A current (hereinafter referred to as a leakage current) flowing through a thin film transistor including an oxide semiconductor when a gate is supplied with a voltage that makes the transistor turn off is 0.1 pA or less, whereas that of a thin film transistor including amorphous silicon is about several hundreds of nanoamperes. For that reason, in the thin film transistor including an oxide semiconductor, storage capacitance can be reduced. That is, the aperture ratio of a pixel having the thin film transistor including an oxide semiconductor can be increased as compared to that of a pixel having the thin film transistor including amorphous silicon. Here, how much the aperture ratio is increased is estimated; the following description is made on the assumption that the leakage current of the thin film transistor including an oxide semiconductor is $1\times10^{-13}$ (A) and that of the thin film transistor including amorphous silicon is $1\times10^{-11}$ (A).

Other parameters for estimating the aperture of a pixel are as follows: the panel size is 3.4 inches, the grayscale to be expressed are 256 gray levels, a voltage input is 10 V, and one frame for display is $1.66\times10^{-2}$ (sec). Moreover, a gate insulating film has a dielectric constant of 3.7 (F/m) and a thickness of $1\times10^{-7}$ (m).

First, the area of a storage capacitor and the aperture ratio in the case where the above-described parameters apply to a panel (referred to as a first panel) in which the number of pixels is 540×RGB×960 are estimated. The size of a pixel in the panel is 26 (μm)×78 (μm), that is, $2.03\times10^{-9}$ (m$^2$). The area excluding a region occupied by a wiring and a TFT is $1.43\times10^{-9}$ (m$^2$), and the area of the region occupied by the wiring and the TFT is $6.00\times10^{-10}$ (m$^2$).

In the first panel that includes a pixel having a storage capacitor and a thin film transistor including an oxide semiconductor layer, a minimum necessary capacitance of the storage capacitor is $4.25\times10^{-14}$ (F). In this case, the area necessary for the capacitor is $1.30\times10^{-10}$ (m$^2$); the storage capacitor accounts for 6.4% of the area of the pixel and the aperture ratio is 64.0%. Further, in the first panel, a minimum necessary capacitance of a storage capacitor is $4.25\times10^{-12}$ (F) in a pixel having a thin film transistor including amorphous silicon. In this case, the area necessary for the capacitor is $1.30\times10^{-8}$ (m$^2$), which means that the proportion of the area of the storage capacitor occupying the pixel is 639.9%, that is, the storage capacitor requires a larger area than the size of the pixel.

In addition, the area of a storage capacitor and the aperture ratio in the case where the above-described parameters apply to a panel (referred to as a second panel) in which the number of pixels is 480×RGB×640 are estimated. The size of a pixel in the panel is 36 (μm)×108 (μm), that is, $3.89\times10^{-9}$ (m$^2$). The area excluding a region occupied by a wiring and a TFT is $3.29\times10^{-9}$ (m$^2$), and the area of the region occupied by the wiring and the TFT is $6.00\times10^{-10}$ (m$^2$).

In the second panel that includes a pixel having a storage capacitor and a thin film transistor including an oxide semiconductor layer, a minimum necessary capacitance of the storage capacitor is $4.25\times10^{-14}$ (F). In this case, the area necessary for the capacitor is $1.30\times10^{-10}$ (m$^2$); the storage capacitor accounts for 3.3% of the area of the pixel and the aperture ratio is 81.2%. Further, in the second panel, a minimum necessary capacitance of a storage capacitor is $4.25\times10^{-12}$ (F) in a pixel having a thin film transistor including amorphous silicon. In this case, the area necessary for the capacitor is $1.30\times10^{-8}$ (m$^2$), which means that the proportion of the area of the storage capacitor occupying the pixel is 333.8%, that is, the storage capacitor requires a larger area than the size of the pixel.

Figure 14A:
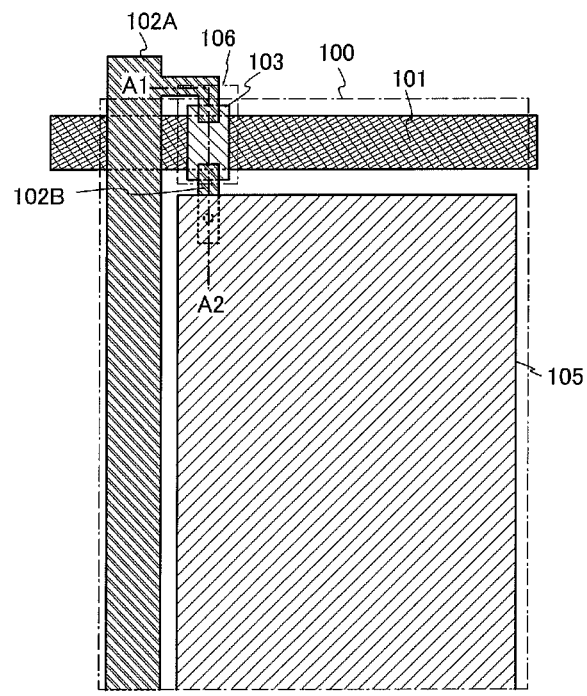
FIGS. 14A and 14B are a top view and a cross-sectional view of a liquid crystal display device.
Figure 14B:
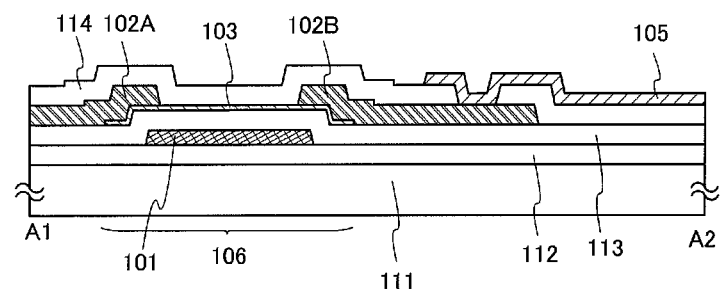

In the first panel and the second panel, the leakage current of the thin film transistor including an oxide semiconductor layer is extremely small, so that it is possible to omit a capacitor line for forming a storage capacitor. Specifically, FIGS. 14A and 14B illustrate a top view and a cross-sectional view of the case where a capacitor line is omitted. The top view of a pixel illustrated in FIG. 14A corresponds to a view in which a capacitor line is eliminated from the top view in FIG. 1A in Embodiment 1. As seen from the top view in FIG. 14A and the cross-sectional view in FIG. 14B, a region occupied by the pixel electrode 105, that is, the aperture ratio can be increased with the use of the thin film transistor including the oxide semiconductor layer. Furthermore, as seen from the cross-sectional view in FIG. 14B, by the use of the thin film transistor including the oxide semiconductor layer, a capacitor line can be omitted and the region occupied by the pixel electrode 105 can be increased. In other words, it is possible to increase the aperture ratio. Note that the aperture ratio in FIGS. 14A and 14B can be increased to 70.4% under the conditions for the first panel, and can be increased to 84.5% under the conditions for the second panel.

As has been described above, as the resolution of a panel is increased, it is more advantageous to use an oxide semiconductor layer in a thin film transistor in terms of the increase in aperture ratio.

This application is based on Japanese Patent Application serial No. 2009-235287 filed with Japan Patent Office on Oct. 9, 2009, the entire contents of which are hereby incorporated by reference.

EXPLANATION OF REFERENCE

100: pixel, 101: wiring, 102: wiring, 103: oxide semiconductor layer, 104: capacitor line, 105: pixel electrode, 106: thin film transistor, 111: substrate, 112: base film, 113: gate insulating film, 114: oxide insulating layer, 121: opening portion, 400: pixel, 401: wiring, 403: oxide semiconductor layer, 404: capacitor line, 405: pixel electrode, 406: thin film transistor, 411: substrate, 412: base film, 413: gate insulating film, 414: oxide insulating layer, 700: substrate, 701: pixel, 702: pixel portion, 703: scan line driver circuit, 704: signal line driver circuit, 880: pixel, 881: transistor, 882: liquid crystal element, 883: capacitor, 884: wiring, 885: wiring, 886: wiring, 887: wiring, 984: signal, 985: signal, 986: voltage, 102A: wiring, 102B: wiring, 1080: pixel, 1081: transistor, 1082: liquid crystal element, 1083: capacitor, 1084: wiring, 1085: wiring, 1086: wiring, 1088: pixel electrode, 402A: wiring, 402B: wiring, 601A: insulating layer, 601B: insulating layer, 9630: housing, 9631: display portion, 9633: speaker, 9635: operation key, 9636: connection terminal, 9638: microphone, 9672: recording medium insert reading portion, 9676: shutter button, 9677: image receiving portion, 9680: external connecting port, 9681: pointing device

The invention claimed is:

1. A liquid crystal display device comprising:
   a scan line;
   a first pixel including a first transistor electrically connected to a first pixel electrode; and
   a second pixel including a second transistor electrically connected to a second pixel electrode,
   wherein the first pixel is electrically connected to the scan line,
   wherein the first transistor includes an oxide semiconductor layer, the oxide semiconductor layer being over the scan line with a gate insulating film therebetween,
   wherein a width of the oxide semiconductor layer is larger than that of the scan line, and
   wherein the second pixel electrode of the second pixel and the oxide semiconductor layer of the first pixel overlap with each other.

2. The liquid crystal display device according to claim 1, wherein the width of the oxide semiconductor layer is larger than that of the scan line in a channel width direction of the first transistor.

3. The liquid crystal display device according to claim 1, wherein the width of the oxide semiconductor layer is larger than that of the scan line in a channel length direction of the first transistor.

4. The liquid crystal display device according to claim 1, further comprising an oxide insulating layer,
   wherein the oxide insulating layer is over and in contact with at least part of the oxide semiconductor layer.

5. The liquid crystal display device according to claim 4, wherein the oxide insulating layer includes phosphorus or boron.

6. A liquid crystal display device comprising:
   a scan line;
   a signal line;
   a first pixel including a first transistor electrically connected to a first pixel electrode; and
   a second pixel including a second transistor electrically connected to a second pixel electrode,
   wherein the first pixel is electrically connected to the scan line and the signal line,
   wherein the first transistor includes an oxide semiconductor layer, the oxide semiconductor layer being over the scan line with a gate insulating film therebetween,
   wherein a width of the oxide semiconductor layer is larger than that of the scan line,
   wherein the signal line includes a portion which is extended along a longitudinal direction of the scan line and over the scan line, and
   wherein the second pixel electrode of the second pixel and the oxide semiconductor layer of the first pixel are overlapped with each other.

7. The liquid crystal display device according to claim 6, wherein the width of the oxide semiconductor layer is larger than that of the scan line in a channel width direction of the first transistor.

8. The liquid crystal display device according to claim 6, wherein the width of the oxide semiconductor layer is larger than that of the scan line in a channel length direction of the first transistor.

9. The liquid crystal display device according to claim 6, further comprising an oxide insulating layer,
   wherein the oxide insulating layer is over and in contact with at least part of the oxide semiconductor layer.

10. The liquid crystal display device according to claim 9, wherein the oxide insulating layer includes phosphorus or boron.

11. The liquid crystal display device according to claim 6,
    wherein the first pixel further comprises an insulating layer, and
    wherein the insulating layer is between the gate insulating film and the signal line.

12. The liquid crystal display device according to claim 11, wherein an edge portion of the oxide semiconductor layer is covered with the insulating layer.

13. A liquid crystal display device comprising:
    a scan line;
    a signal line;
    a first pixel including a first transistor, a wiring, and a first pixel electrode; and
    a second pixel including a second transistor electrically connected to a second pixel electrode,
    wherein the first pixel is electrically connected to the scan line and the signal line,
    wherein the wiring of the first pixel is electrically connected to the first pixel electrode,
    wherein the first transistor includes an oxide semiconductor layer, the oxide semiconductor layer being over the scan line with a gate insulating film therebetween,
    wherein a width of the oxide semiconductor layer is larger than that of the scan line,
    wherein the signal line includes a portion which is extended along a longitudinal direction of the scan line and over the scan line, and
    wherein the second pixel electrode of the second pixel and the oxide semiconductor layer of the first pixel are overlapped with each other.

14. The liquid crystal display device according to claim 13, wherein the width of the oxide semiconductor layer is larger than that of the scan line in a channel width direction of the first transistor.

15. The liquid crystal display device according to claim 13, wherein the width of the oxide semiconductor layer is larger than that of the scan line in a channel length direction of the first transistor.

16. The liquid crystal display device according to claim 13, further comprising an oxide insulating layer,
    wherein the oxide insulating layer is over and in contact with at least part of the oxide semiconductor layer.

17. The liquid crystal display device according to claim 16, wherein the oxide insulating layer includes phosphorus or boron.

18. The liquid crystal display device according to claim 13,
    wherein the first pixel further comprises a first insulating layer and a second insulating layer,
    wherein the first insulating layer is between the gate insulating film and the signal line, and
    wherein the second insulating layer is between the gate insulating film and the wiring of the first pixel.

19. The liquid crystal display device according to claim 18, wherein an edge portion of the oxide semiconductor layer is covered with the first insulating layer and the second insulating layer.

* * * * *